United States Patent [19]
Yamamoto et al.

[11] Patent Number: 5,770,494
[45] Date of Patent: *Jun. 23, 1998

[54] PROCESS OF FABRICATING SEMICONDUCTOR DEVICE HAVING GATE STRUCTURE DOPED THROUGH DIFFUSION FROM REFRACTORY METAL SILICIDE INTO POLYSILICON

[75] Inventors: Toyoji Yamamoto; Kiyoshi Takeuchi, both of Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 617,207

[22] Filed: Mar. 18, 1996

[30] Foreign Application Priority Data

Mar. 24, 1995 [JP] Japan .................................. 7-065793

[51] Int. Cl.$^6$ .................. H01L 21/8234; H01L 21/3205; H01L 21/4763
[52] U.S. Cl. .......................................... 430/232; 438/592
[58] Field of Search ............................... 437/34, 57, 193, 437/200; 438/586, 592, 585, 229

[56] References Cited

U.S. PATENT DOCUMENTS

| | | | |
|---|---|---|---|
| 4,385,947 | 5/1983 | Halfacre et al. | 437/34 |
| 4,450,620 | 5/1984 | Fuls et al. | 29/571 |
| 4,613,885 | 9/1986 | Haken | 437/57 |
| 4,703,552 | 11/1987 | Baldi et al. | 437/200 |
| 4,740,479 | 4/1988 | Neppl et al. | 437/200 |
| 4,945,070 | 7/1990 | Hsu | 437/160 |
| 4,962,052 | 10/1990 | Asayama et al. | 437/34 |
| 5,032,537 | 7/1991 | Yoshizumi et al. | 437/34 |
| 5,395,799 | 3/1995 | Yu | 437/200 |
| 5,418,179 | 5/1995 | Hotta | 437/57 |
| 5,447,872 | 9/1995 | Segawa et al. | 437/34 |
| 5,512,497 | 4/1996 | Ikeda et al. | 437/200 |

FOREIGN PATENT DOCUMENTS 0319213   6/1989   European Pat. Off. .

OTHER PUBLICATIONS

"Self–Aligned Tungsten Strapped Source/Drain and Gate Technology Realizing the Lowest Sheet Resistance for Sub–quarter Micron CMOS" Sekine et al; 1994; pp. 493–496; IEEE.

"Design Methodology of Deep Submicron CMOS Devices for IV Operation" Oyamatsu et al date unknown; pp. 89–90.

"SATPOLY: A self–Aligned Tungsten On Ploysilicon Process for CMOS VLSI Applications" Wong et al; 1989; IEEE; pp. 1355–1361.

"21 PSEC Switching O lum–CMOS at Room Temperature Using High Performance Co Salicide Process" Yamazaki et al; 1993; IEDM; pp. 906–908.

*Primary Examiner*—Brian Dutton
*Attorney, Agent, or Firm*—Hayes, Soloway, Hennessey, Grossman & Hage, P.C.

[57] ABSTRACT

Using a lamination of a tungsten silicide layer and a non-doped polysilicon layer as a mask, a dopant impurity is ion implanted into a semiconductor substrate so as to form impurity regions and dope the tungsten silicide layer with the dopant impurity, and the dopant impurity is diffused from the tungsten silicide layer into the non-doped polysilicon layer during the activation of the dopant impurity introduced into the substrate, thereby making the process simple.

9 Claims, 8 Drawing Sheets

PROCESS OF FABRICATING SEMICONDUCTOR DEVICE HAVING GATE STRUCTURE DOPED THROUGH DIFFUSION FROM REFRACTORY METAL SILICIDE INTO POLYSILICON

This is a continuation of copending application Ser. No. 08/617,207 filed on Mar. 18, 1996.

FIELD OF THE INVENTION

This invention relates to a process of fabricating a semiconductor device and, more particularly, to a process of fabricating a semiconductor device having a gate structure doped through a diffusion from a refractory metal silicide strip into a polysilicon strip.

DESCRIPTION OF THE RELATED ART

A MOS (Metal-Oxide-Semiconductor) field effect transistor is one of the essential circuit components of a semiconductor integrated circuit device because of the low power consumption and easy circuit design. The MOS field effect transistors are broken down into an n-channel and p-channel, and the n-channel transistor is combined with the p-channel transistor so as to form a complementary transistor. complementary transistor consumes extremely small amount of current, and is preferable for ultra large scale integration. There are two requirements for a design work on the gate electrode of the complementary transistor.

The first requirement is a dual gate structure. N-type doped polysilicon is usually used for the gate electrodes of the complementary transistor, i.e., the n-channel/p-channel transistors. However, when the gate electrodes of the n-channel/p-channel transistors are scaled down to 0.5 micron, the n-type doped polysilicon electrode requires a buried p-type layer embedded in a surface of the semiconductor substrate so as to regulate the threshold to about 0.5 volt. If the n-channel/p-channel transistors are further scaled down, the manufacturer makes the buried p-type layer thinner and heavier in dopant concentration. However, the buried p-type layer reaches the limit. For this reason, the miniature complementary transistor requires an n-type doped polysilicon electrode for the n-channel transistor and a p-type doped polysilicon electrode for the p-channel transistor.

The second requirement is a laminated gate structure. The resistivity of a doped polysilicon gate electrode is too high to accelerate signal propagation, and a low-resistance gate structure is necessary for high-speed signal propagation. A low-resistance conductive layer is laminated on the doped polysilicon gate electrode, and the laminated gate structure is used for high-speed signal propagation path.

The two requirements are not independent, and the manufacturer has tried to provide a gate structure simultaneously meeting the two requirements.

There are two approaches for a low-resistive gate structure. One of the approaches is to form a low resistance layer on a doped polysilicon strip already patterned. Another approach is to pattern a lamination of a doped polysilicon layer and a low-resistance layer into a gate electrode.

FIGS. 1A to 1F illustrate the process sequence of the first approach, and the process is known as a self-aligned silicide process or a salicide process. A p-type well $1a$ and an n-type well $1b$ are formed in a surface portion of a p-type silicon substrate 1, and a field oxide layer 2 is selectively grown on the p-type silicon substrate 1 for providing an appropriate electrical isolation.

The surface of the p-type well $1a$ and the surface of the n-type well $1b$ are thermally oxidized, and thin silicon oxide layers cover the surface of the p-type well $1a$ and the surface of the n-type well $1b$.

Non-doped polysilicon is deposited over the thin silicon oxide layers and the field oxide layer 2, and the non-doped polysilicon layer covers them. In the following description, term "non-doped" means that dopant impurity is negligible, i.e., not greater than $1\times10^{19}$ cm$^3$. An appropriate photo-resist mask is provided on the non-doped polysilicon layer, and the non-doped polysilicon layer is selectively etched away so as to form non-doped polysilicon strips $3a$ and $3b$ on the thin silicon oxide layers.

Silicon oxide is deposited over the entire surface of the structure, and a silicon oxide layer topographically extends over the thin silicon oxide layers, the non-doped polysilicon strips $3a/3b$ and the field oxide layer 2. The silicon oxide layer is anisotropically etched until the p-type well $1a$ and the n-type well $1b$ are exposed again. Side wall spacers $4a/4b$ and $4c/4d$ are formed on the side surfaces of the non-doped polysilicon strips $3a$ and $3b$, and gate oxide layers $5a$ and $5b$ are left beneath the non-doped polysilicon strips $3a$ and $3b$ as shown in FIG. 1A.

Subsequently, a photo-resist mask $6a$ is patterned through lithographic techniques, and covers the n-type well $1b$. Arsenic is ion implanted into the p-type well $1a$ and the non-doped polysilicon strip $3a$, and an n-type source region $7a$ and an n-type drain region $7b$ are formed in the p-type well $1a$ in a self-aligned manner with the side wall spacers $4a/4b$. The arsenic is further introduced into the non-doped polysilicon strip $3a$, and partially converts the non-doped polysilicon strip $3a$ to an n-type doped polysilicon layer $3c$ as shown in FIG. 1B.

The photo-resist mask $6a$ is stripped off, and a new photo-resist mask $6b$ is provided on the p-type well $1a$. Boron difluoride (BF$_2$) is ion implanted into the n-type well $1b$, and a p-type source region $7c$ and a p-type drain region $7d$ are formed in the n-type well $1b$ in a self-aligned manner with the side wall spacers $4c/4d$. The boron difluoride is also introduced into the non-doped polysilicon strip $3b$, and partially converts the non-doped polysilicon to a p-type doped polysilicon layer $3d$ as shown in FIG. 1C.

The photo-resist mask $6b$ is stripped off, and the implanted dopant impurities are activated through a relatively high-temperature heat treatment. The implanted arsenic and the boron are diffused over the non-doped polysilicon strips $3a$ and $3b$, and an arsenic-doped polysilicon gate electrode $3e$ and a boron-doped polysilicon gate electrode $3f$ are formed on the gate oxide layers $5a$ and $5b$, respectively, as shown in FIG. 1D.

The arsenic and the boron are diffused through grain boundaries of the polysilicon, and the diffusion in the polysilicon is faster than the diffusion in the single crystal silicon. For this reason, the shallow source/drain regions $7a/7b$ and $7c/7d$ are concurrently formed together with the doped polysilicon electrodes $3e/3f$.

Subsequently, refractory metal such as titanium or cobalt is deposited over the entire surface of the resultant structure shown in FIG. 1D, and a refractory metal layer $8a$ topographically extends over the source/drain regions $7a$ to $7d$, the side wall spacers $4a$ to $4d$, the doped polysilicon gate electrodes $3e/3f$ and the field oxide layer 2 as shown in FIG. 1E.

The refractory metal layer $8a$ is treated with heat, and is selectively converted to the refractory metal silicide layers $8a$ to $8g$. However, the silicon oxide does not convert the refractory metal layer 8a to a refractory metal silicide layer, and the remaining refractory metal layer is etched away in an etching solution. As a result, the refractory metal silicide layers 8b/8d, 83/8g, 8c and 8f are laminated on the n-type source/drain regions 7a/7b, the p-type source/drain regions 7c/7d, the n-type doped polysilicon gate electrode 3e and the p-type doped polysilicon gate electrode 3f as shown in FIG. 1F.

The first prior art process has the following advantage. The advantage is simplicity. The source/drain regions 7a/7b or 7c/7d are concurrently formed together with the doped polysilicon gate electrode 3e/3f, and the dual gate structure does not require an additional processing.

However, the first prior art process has various problems in the silicidation. For example, available refractory metal tends to increase the resistivity due to a heat treatment in the later stages of the first process. The temperature range for the silicidation is narrow, and the manufacturer is expected to strictly control the temperature in the silicidation. The shallow source/drain regions 7a/7b and 7c/7d are desirable; however, the manufacturer can not make the refractory metal silicide layers 8b to 8g thicker than the shallow source/drain regions 7a/7b and 7c/7d. While the heat is converting the refractory metal layer 8a to the silicide layers 8b to 8g, the silicon tends to be diffused in the refractory metal layer 8a on the side wall spacers 4a to 4d, and a short-circuit is liable to take place.

Even if the salicide is replaced with tungsten layers selectively grown on the gate electrode and the source/drain regions, the manufacturer still suffers from unstable growing conditions, the limitation of temperature in the later stages and the problem of short-circuit formation between the gate electrode and the source/drain regions.

FIGS. 2A to 2H illustrates the second prior art process sequence, and tungsten silicide (WSi$_2$) or titanium silicide (TiSi$_2$) is available for a low-resistivity layer.

A p-type well 11a and an n-type well 11b are formed in a surface portion of a p-type silicon substrate 11, and a field oxide layer 12a is selectively grown on the p-type silicon substrate 11 for providing an appropriate electrical isolation.

The surface of the p-type well 11a and the surface of the n-type well 11b are thermally oxidized, and thin silicon oxide layers 12b and 12c cover the surface of the p-type well 11a and the surface of the n-type well 11b.

Non-doped polysilicon is deposited over the thin silicon oxide layers 12b/12c and the field oxide layer 12a, and a non-doped polysilicon layer 13 covers them as shown in FIG. 2A.

Subsequently, a photo-resist mask 14a is provided through the lithographic techniques, and covers the non-doped polysilicon layer 13 over the n-type well 11b. Phosphorous is ion implanted into the non-doped polysilicon strip 13a over the p-type well 11a, and the non-doped polysilicon layer 13 is partially converted to an n-type doped polysilicon 13a as shown in FIG. 2B.

The photo-resist mask 14a is stripped off, and a new photo-resist mask 14b is provided on the n-type doped polysilicon layer 13a over the p-type well 11a. Boron is ion implanted into the non-doped polysilicon layer 13 over the n-type well 1b, and converts the non-doped polysilicon layer 13 to a p-type doped polysilicon layer 13b as shown in FIG. 2C.

The photo-resist mask 14b is stripped off, and a refractory metal silicide layer 15 is deposited over the n-type/p-type polysilicon layers 13a/13b as shown in FIG. 2D.

Though not shown in the drawings, an appropriate photo-resist mask is provided on the refractory metal silicide layer 15, and the photo-resist mask covers the parts of the refractory metal silicide layer 15 over central areas of the p-type/n-type wells 11a/11b. Using the photo-resist mask, the refractory metal silicide layer 15, the n-type/p-type polysilicon layers 13a/13b and the silicon oxide layers 12b/12c are successively patterned, and gate structures 16a and 16b are formed on gate oxide layers 12d and 12e.

The gate structure 16a includes an n-type doped polysilicon strip 13c and a refractory metal silicide strip 15a laminated on the n-type doped polysilicon strip 13c.

On the other hand, the gate structure 16b includes a p-type doped polysilicon strip 13d and a refractory metal silicide strip 15b laminated on the p-type doped polysilicon strip 13d. The resultant structure is illustrated in FIG. 2E.

Subsequently, a photo-resist mask 14c is provided through the lithographic techniques on the n-type well 11b, and arsenic is ion implanted into the p-type well 11a. The arsenic forms an n-type source region 17a and an n-type drain region 17b in a self-aligned manner with the gate structure 16a as shown in FIG. 2F.

The photo-resist mask 14c is stripped off, and a new photo-resist mask 14d is provided through the lithographic techniques on the p-type well 11a, and the gate structure 16a and the n-type source/drain regions 17a/17b are covered with the photo-resist mask 14d. Boron difluoride is ion implanted into the n-type well 11b. The boron forms a p-type source region 17c and a p-type drain region 17d in a self-aligned manner with the gate structure 16b as shown in FIG. 2H.

The photo-resist mask 14d is stripped off, and the implanted dopant impurities are subjected to a heat-treatment. The dopant impurities are diffused over the polysilicon strips 13c and 13d, and the dopant impurities in the source/drain regions 17a/17b and 17c/17d are activated as shown in FIG. 2H.

The n-type dopant impurity and the p-type dopant impurity are selectively introduced into the non-doped polysilicon layer 13 before the deposition of the refractory metal silicide layer 15, and the lamination of the n-type/p-type doped polysilicon layer 13a/13b and the refractory metal silicide layer 15 is patterned into the gate structures 16a/16b. The second prior art process allows the manufacturer to independently determine the thickness of the non-doped polysilicon layer 13 and the thickness and the material of the refractory metal silicide layer, because the source and drain regions 17a/17b and 17c/17d are formed after the patterning stage of the gate structure 16a/16b. Moreover, the refractory metal silicide layer 15 is simply grown on the non-doped polysilicon layer 13, and the second prior art process is free from complicated process control for the silicidation. However, the selective introduction of the dopant impurities makes the second prior art process complicated due to the additional lithography repeated twice, and, accordingly, increases the production cost.

Thus, the first prior art process is simple, but encounters a problem in the salicidation. On the other hand, the second prior art process is free from the salicidation, but encounters a problem in the complicated process sequence.

SUMMARY OF THE INVENTION

It is therefore an important object of the present invention to provide a process of fabricating a semiconductor device which is simple and free from the complexity of the salicidation.

The present inventors contemplated the problems, and found that high temperature diffused dopant impurity from a low resistance layer into a polysilicon layer. The present inventors concluded that a polysilicon layer could be doped through a diffusion from a heat-resisting low-resistance substance.

In accordance with one aspect of the present invention, there is provided a process of fabricating a semiconductor device, comprising the steps of: a) preparing a semiconductor layer covered with a gate insulating layer; b) forming a first layer of polysilicon over the gate insulating layer; c) laminating a second layer formed of a heat resistant material capable of withstanding a certain temperature on the first layer; d) patterning the first and second layers into a gate structure on the gate insulating layer having a first strip of the polysilicon and a second strip of the heat resistant material; e) introducing a dopant impurity into the semiconductor layer for forming impurity regions on both sides of a region beneath the gate insulating layer and at least the second strip for doping the heat resistant material therewith; and f) applying heat to the impurity regions for forming source and drain regions and the gate structure for diffusing the dopant impurity from the second strip to the first strip at the certain temperature.

In accordance with another aspect of the present invention, there is provided a process of fabricating first and second field effect transistors opposite in channel conductivity type to each other, comprising the steps of: a) preparing a semiconductor substrate having a first area covered with a first gate insulating layer and a second area covered with a second gate insulating layer; b) forming a first layer of polysilicon over the first and second gate insulating layers; c) laminating a second layer of heat resistant material capable of withstanding a certain temperature on the first layer; d) patterning the first and second layers into a first gate structure on the first gate insulating layer and a second gate structure on the second gate insulating layer, the first gate structure having a first strip of the polysilicon and a second strip of the heat resistant material, the second gate structure having a third strip of the polysilicon and a fourth strip of the heat resistant material; e) covering the second gate structure and the second area with a first mask layer; f) implanting a first dopant impurity of one conductivity type into the first area and at least the second strip so as to form first impurity regions in the first area and dope the second strip with the first dopant impurity; g) removing the first mask layer; h) covering the first gate structure and the second area with a second mask layer; i) implanting a second dopant impurity of the opposite conductivity type to the one conductivity type into the second area and at least the fourth strip so as to form second impurity regions in the second area and dope the fourth strip with the second dopant impurity; j) removing the second mask layer; and k) heating the first and second impurity regions and the second and fourth strips to the certain temperature so as to form first source and drain regions from the first impurity regions and second source and drain regions from the second impurity regions and diffuse the first dopant impurity into the first strip and the second dopant impurity into the third strip.

BRIEF DESCRIPTION OF THE DRAWINGS

The features and advantages of the process of fabricating a semiconductor device according to the present invention will be more clearly understood from the following description taken in conjunction with the accompanying drawings in which.

DESCRIPTION OF THE PREFERRED EMBODIMENT

Figure 1A:
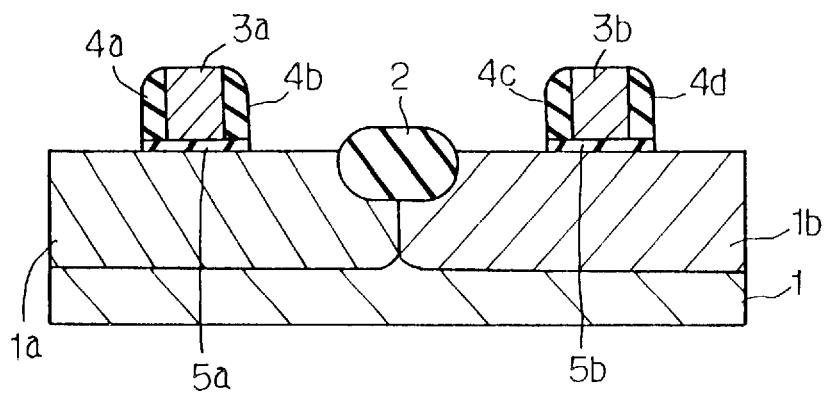
FIGS. 1A to 1F are cross sectional views showing the first prior art process sequence.
Figure 1B:
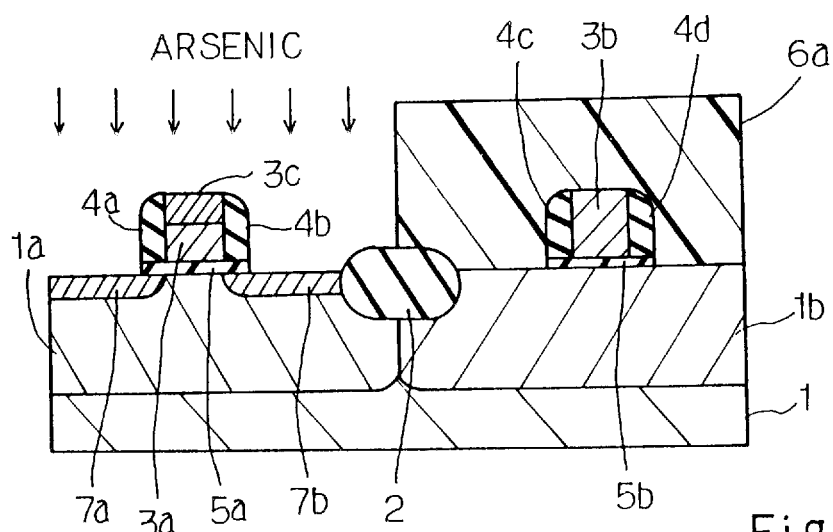
Figure 1C:
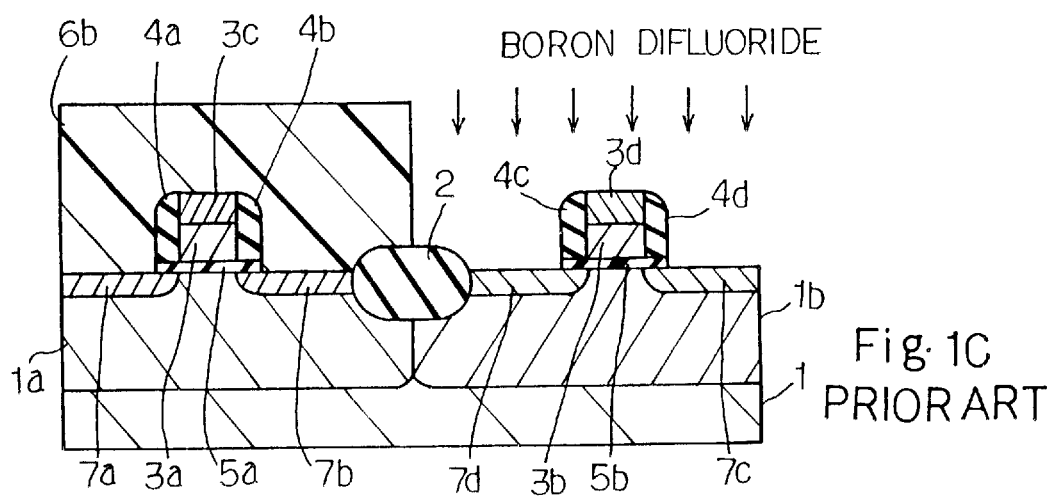
Figure 1D:
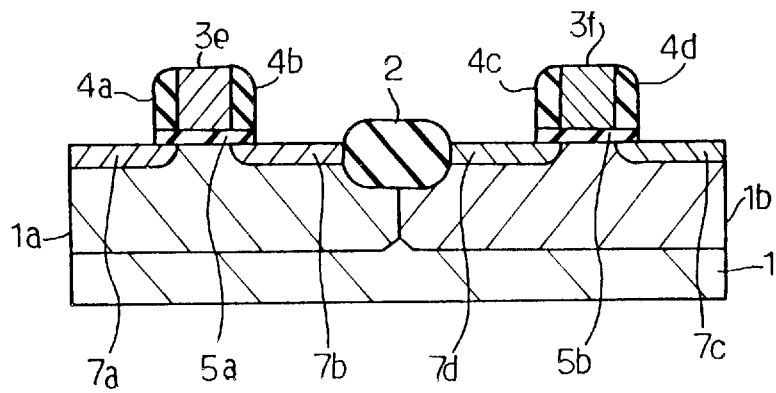
Figure 1E:
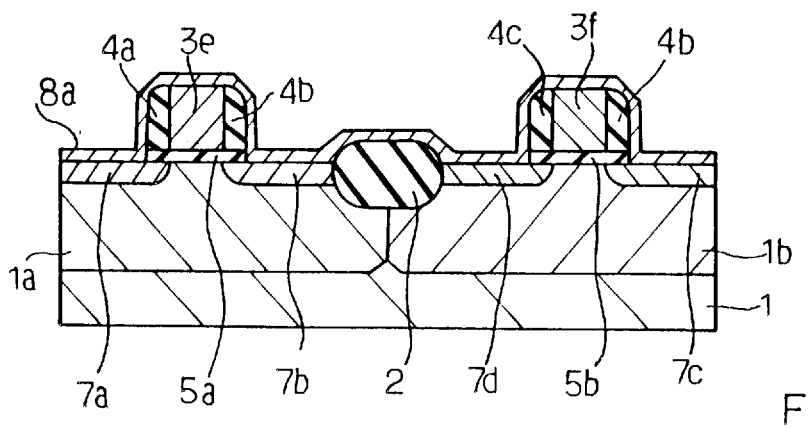
Figure 1F:
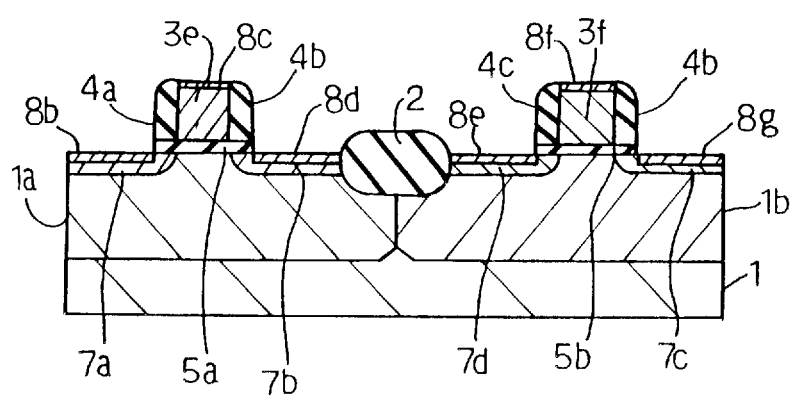
Figure 2A:
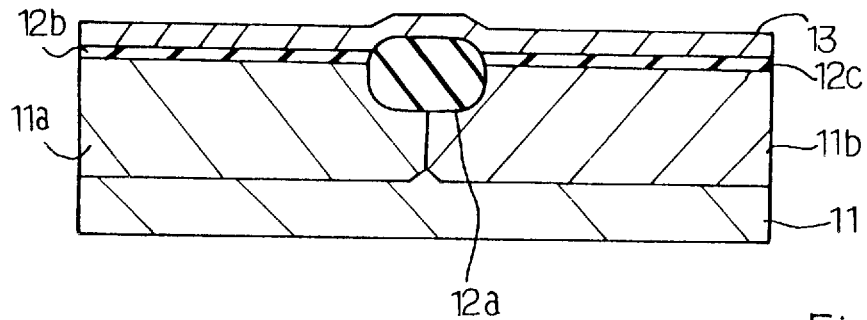
FIGS. 2A to 2H are cross sectional views showing the second prior art process sequence.
Figure 2B:
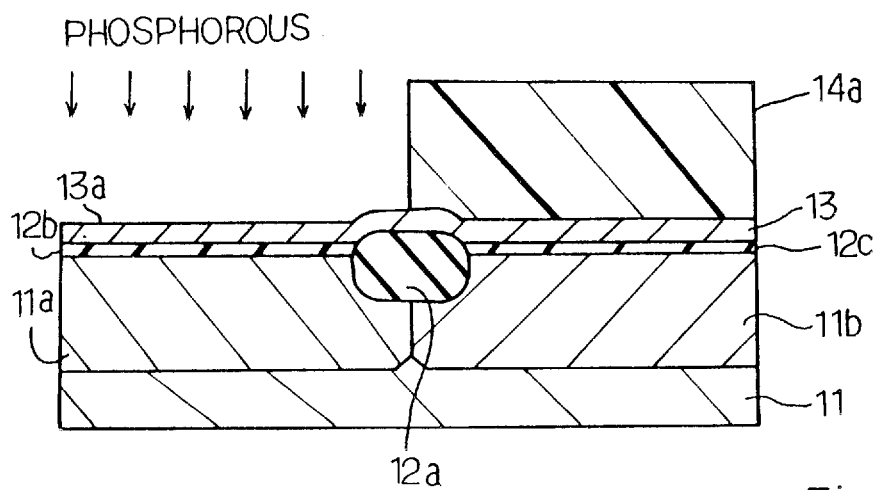
Figure 2C:
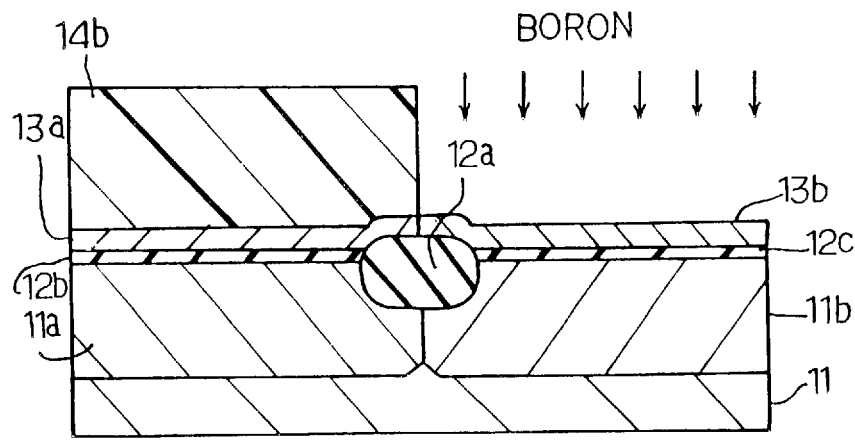
Figure 2D:
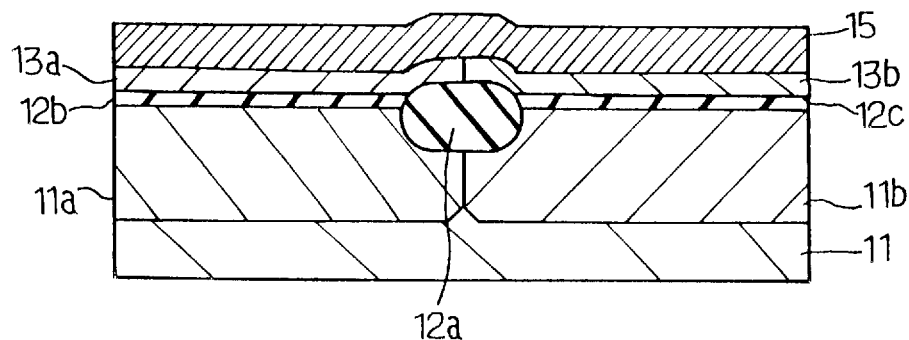
Figure 2E:
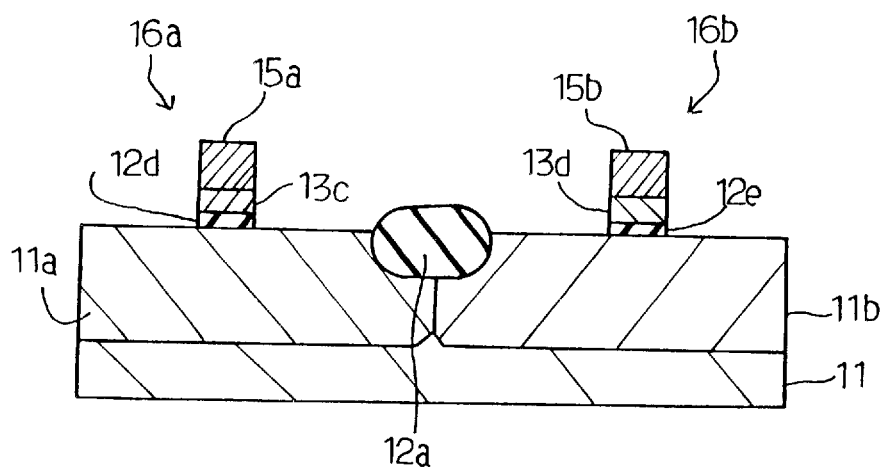
Figure 2F:
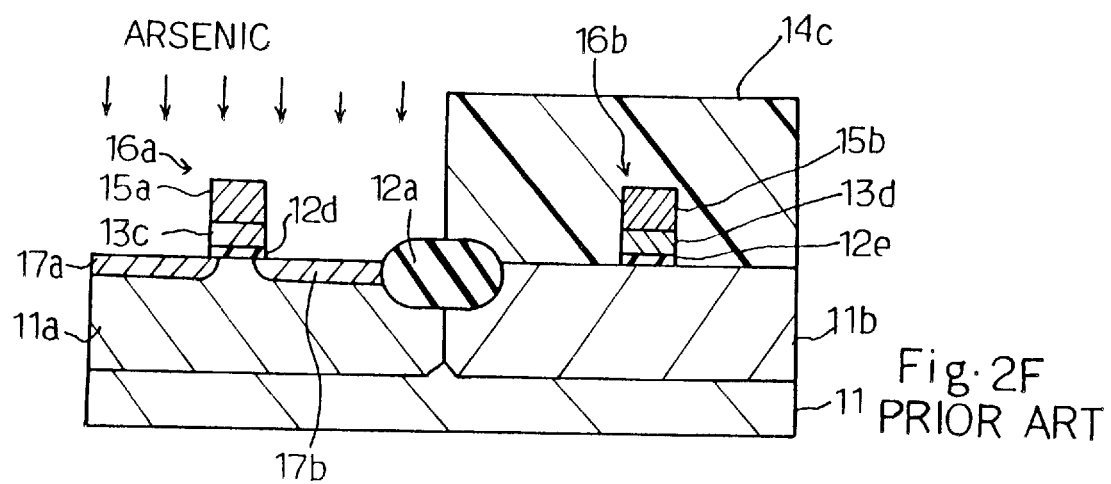
Figure 2G:
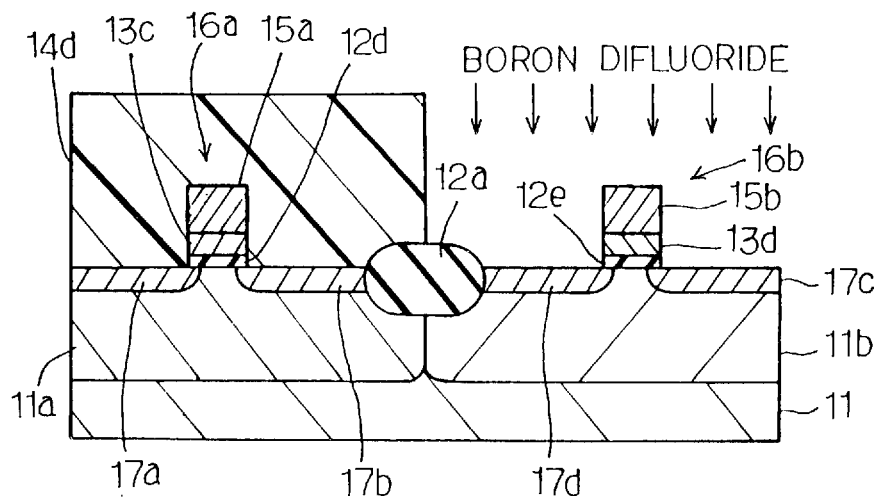
Figure 2H:
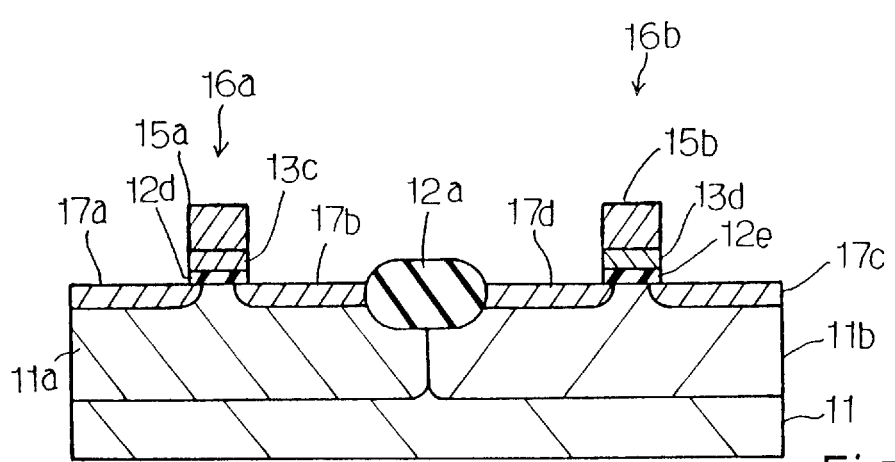

FIGS. 3A to 3F illustrates a process sequence for fabricating a complementary transistor embodying the present invention. The process sequence starts with preparation of a lightly doped p-type silicon substrate 21. A p-type well 21a and an n-type well 21b are selectively formed in a surface portion of the lightly doped p-type silicon substrate 21.

A thick field oxide layer 22 is selectively grown on the surface portion by using the LOCOS (local oxidation of silicon) technique. The surface of the p-type well 21a and the surface of the n-type well 21b are thermally oxidized so as to grow thin silicon oxide layers 23a and 23b, and the thin silicon oxide layers 23a/23b are 3 nanometers to 5 nanometers thick in this instance.

Figure 3A:
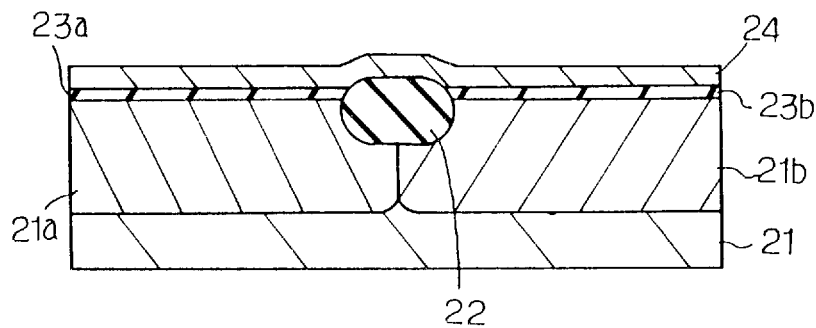
FIGS. 3A to 3H are cross sectional views showing a process sequence for fabricating a complementary transistor according to the present invention.

Subsequently, non-doped polysilicon is deposited to 50 nanometers in thickness by using a low-pressure chemical vapor deposition, and a non-doped polysilicon layer 24 covers the thin silicon oxide layers 23a/23b and the thick field oxide layer 22 as shown in FIG. 3A. Although the non-doped polysilicon may contain a little dopant impurity, the dopant impurity does not exceed $1 \times 10^{19}$ cm$^{-3}$.

Figure 3B:
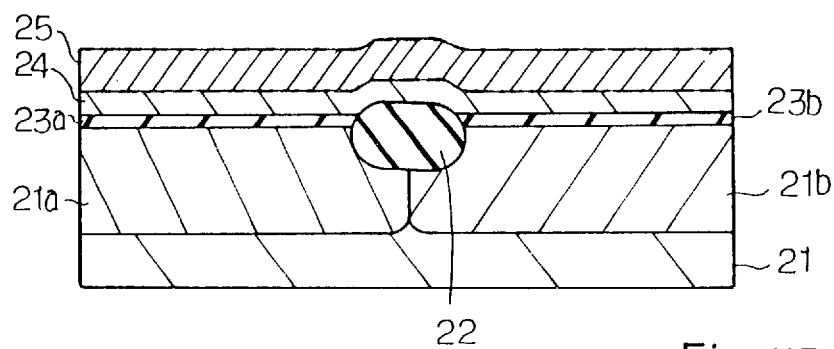

Subsequently, the resultant structure shown in FIG. 3A is placed in a sputtering system (not shown), and a target of tungsten silicide is sputtered. The tungsten silicide is deposited over the non-doped polysilicon layer 24, and the tungsten silicon layer 25 is grown to 10 nanometers in thickness as shown in FIG. 3B. The tungsten silicide has the composition expressed as $WSi_{2.5}$. The tungsten silicide may have the composition $WSi_x$ where x ranges from 1.5 to 3.0.

Figure 3C:
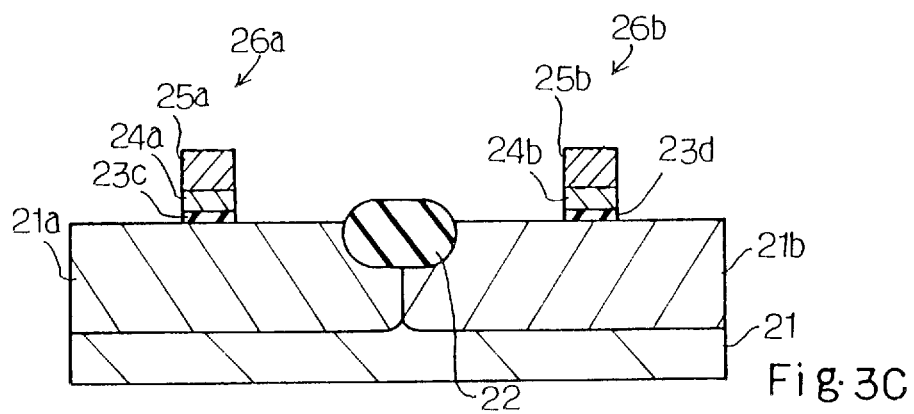

An appropriate photo-resist mask (not shown) is formed on the tungsten suicide layer 25, and partially exposes the tungsten silicide layer 25 on both sides of a central area of each well 21a/21b. The tungsten silicide layer 25, the non-doped polysilicon layer 24 and the thin silicon oxide layers 23a and 23b are successively etched so as to form laminated structures 26a/26b on gate insulating layers 23c/23d. The tungsten silicide strips 25a/25b and the non-doped polysilicon strips 24a/24b form the laminated structures 26a/26b as shown in FIG. 3C.

Figure 3D:
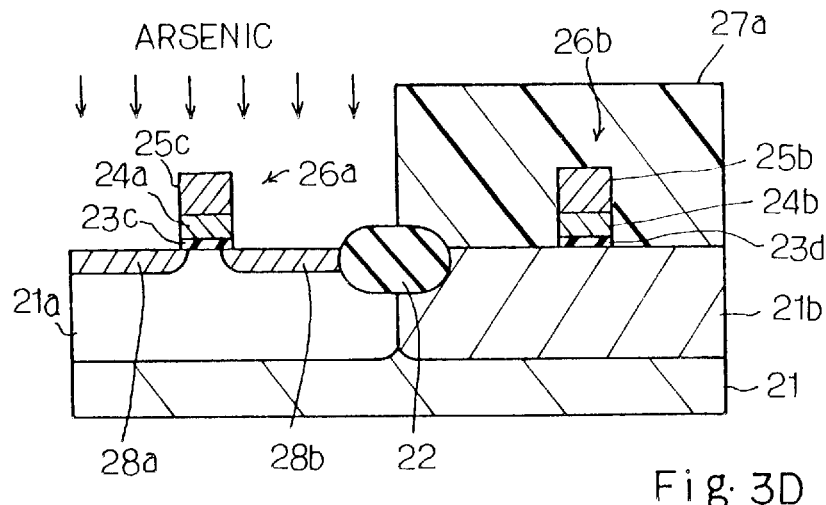

Subsequently, a photo-resist mask 27a is formed through lithographic techniques, and covers the n-type well 21b and the laminated structure 26b. Arsenic is ion implanted into the p-type well 21a at dose of $4 \times 10^{15}$ cm$^{-2}$ under acceleration energy of 50 KeV. The arsenic forms n-type impurity regions 28a and 28b, and is introduced into the tungsten strip 25a. The tungsten strip 25a is converted to an arsenic-doped tungsten strip 25c as shown in FIG. 3D.

Figure 3E:
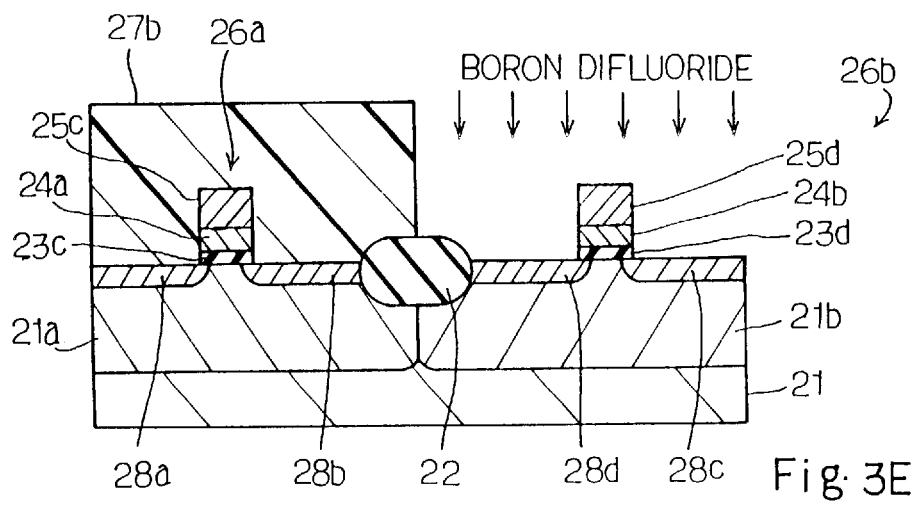

The photo-resist mask 27a is stripped off, and a new photo-resist mask 27b is formed over the p-type well 21a and the laminated structure 26a by using the lithographic techniques. Boron difluoride is ion implanted into the n-type well 21b at dose of $3 \times 10^{15}$ cm$^{-2}$ under acceleration energy of 40 KeV. The boron difluoride forms p-type impurity regions 28c and 28d, and the tungsten strip 25b is converted to a boron-doped tungsten strip 25d as shown in FIG. 3E.

The photo-resist mask 27b is stripped off. The impurity regions 28a/28b and 28c/28d and the laminated structures 26a/26b are heated to 1000 degrees in centigrade for 10 seconds. The arsenic in the impurity regions 28a/28b and the boron in the impurity regions 28c/28d are activated so as to form n-type source/drain regions 29a/29b and p-type source/drain regions 29c/29d. The heat diffuses the arsenic and the boron from the arsenic-doped tungsten silicide strip 25c and the boron-doped tungsten suicide strip 25d into the non-doped polysilicon strips 24a and 24b, and the non-doped polysilicon strips 24a and 24b are converted to an n-type doped polysilicon strip 24c and a p-type doped polysilicon strip 24d as shown in FIG. 3F.

The n-type doped polysilicon strip 24c and the arsenic-doped tungsten strip 25c form in combination a gate electrode 30a on the gate insulating layer 23c, and the p-type doped polysilicon strip 24d and the boron-doped tungsten silicide layer 25d as a whole constitute a gate electrode 30b on the gate insulating layer 23d. The gate electrode 30a, the gate insulating layer 23c and the n-type source/drain regions 29a/29b constitute an n-channel type field effect transistor, and the gate electrode 30b, the gate insulating layer 23d and the p-type source/drain regions 29c/29d constitute a p-channel type field effect transistor.

Figure 3F:
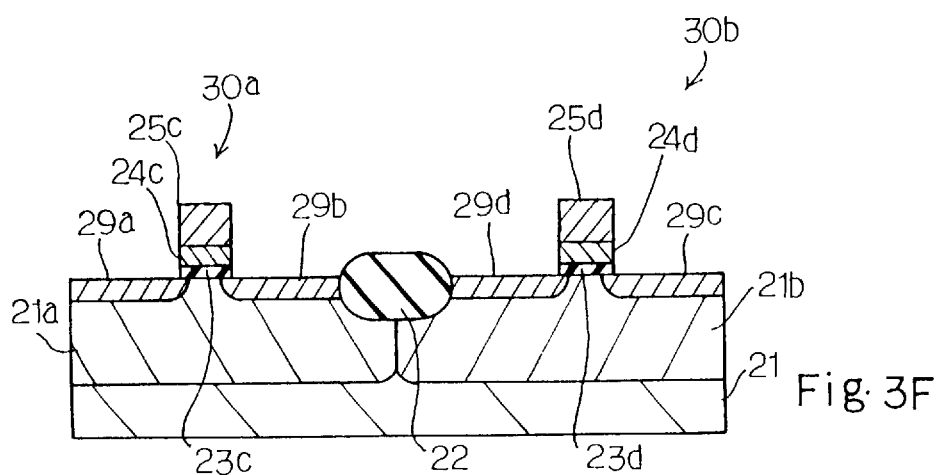
Figure 3G:
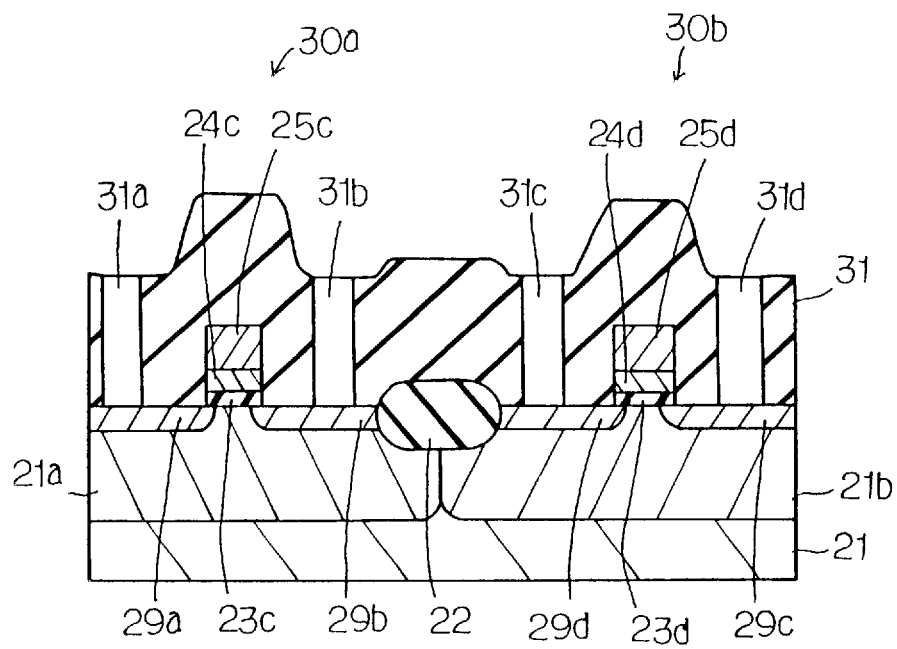

An inter-level insulating layer 31 is formed over the entire surface of the resultant structure shown in FIG. 3F, and the gate electrodes 30a/30b are covered with the inter-level insulating layer 31. An appropriate photo-resist mask (not shown) is provided on the inter-level insulating layer 31, and the inter-level insulating layer 31 is selectively etched away so as to form contact holes 31a, 31b, 31c and 31d as shown in FIG. 3G.

Figure 3H:
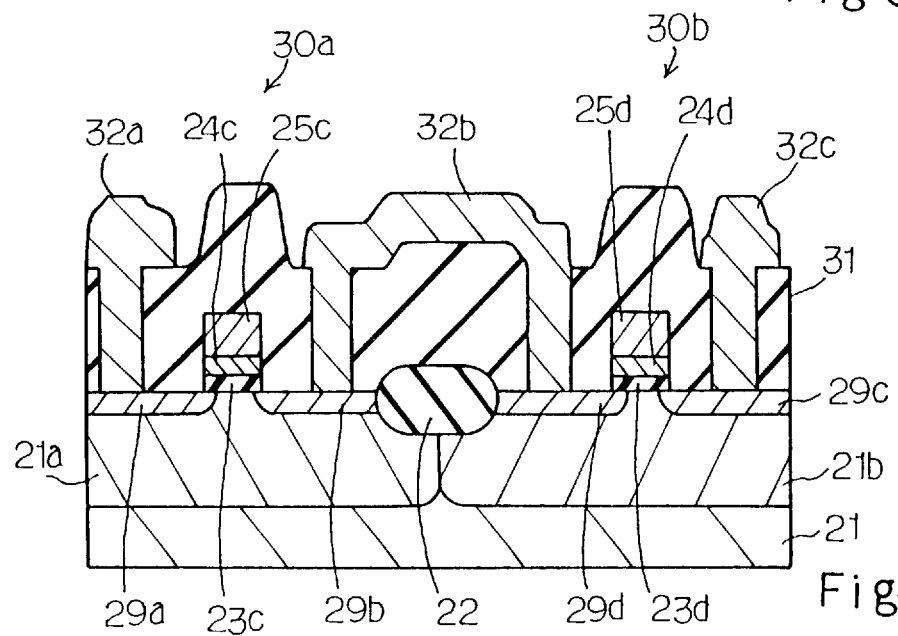

A conductive substance such as aluminum alloy is deposited over the inter-level insulating layer 31, and the aluminum alloy layer is held in contact through the contact holes 31a to 31d with the source/drain regions 29a/29b and 29c/29d. An appropriate photo-resist mask (not shown) is formed on the aluminum alloy layer, and the aluminum alloy layer is patterned into wirings 32a, 32b and 32c. A ground potential is supplied through the wiring 32a to the n-type source region 29a, and a positive power voltage is supplied through the wiring 32c to the p-type source region 29c. The wiring 42b interconnects the n-type drain region 29b and the p-type drain region 29d, and the n-channel type field effect transistor and the p-channel type field effect transistor form in combination a complementary transistor as shown in FIG. 3H.

The present inventors evaluated the gate electrode 30a and 30b as follows. The gate electrodes 30a/30b, the gate insulating layers 23c/23d and the p-type/n-type wells 21a/21b seemed to form capacitors CP.

The present inventors measured the capacitances $C_{INV}$ at an inverting bias and the capacitances $C_{ACC}$ at an accumulating bias. When we measured the capacitances $C_{ACC}$, only the gate insulating layers 23c/23d served as dielectric films of the target capacitors. On the other hand, the capacitance $C_{INV}$ was representative of the capacitance of the series combination of the capacitor CP and a capacitor across an inversion layer formed in the doped polysilicon strip 24c/24d. If the doped polysilicon strips 24c/24d had been insufficiently doped, a depletion layer took place, and the capacitance $C_{INV}$ became smaller than the capacitance $C_{ACC}$. The ratio $C_{INV}/C_{ACC}$ was a criterion of the doping level.

The present inventors confirmed the ratio $C_{INV}/C_{ACC}$ to be greater than 0.9, and the doped polysilicon strips 24c and 24d were sufficiently doped with the arsenic and the boron, respectively.

In general, when a tungsten silicide strip and a non-doped polysilicon layer are thick, when the amount of ion-implanted dopant impurity is small, when a heat-treatment is carried out at a low temperature, when the heat-treatment is completed within a short time period, the non-doped polysilicon layer is insufficiently doped with the dopant impurity. In an actual process, the tungsten silicide layer is equal to or less than 500 nanometers thick, the non-doped polysilicon layer is equal to or less than 200 nanometers thick, and the dose is equal to or greater than $1\times10^{15}$ cm$^{-2}$. In order to complete the diffusion within a practical time period, the tungsten silicide layer is heated to at least 800 degrees in centigrade. The lower the temperature is, the longer the heat treatment is carried out. The heat treatment at 1000 degrees in centigrade is completed within several seconds. However, if the heat treatment is carried out at 900 degrees in centigrade, the diffusion requires about 10 minutes.

If the polysilicon strips 24c and 24d are insufficiently doped, the threshold is shifted, and the field effect transistor decreases the channel current. However, the decrements or the margins depend upon application, and the above described conditions should be optimized for the application.

Most of the material available for the silicide increases the resistivity together with the temperature in the heat treatment, and this tendency is clear in a thin line. However, even if the heat treatment is carried out at 1000 degrees in centigrade, the tungsten silicide decreases the sheet resistance until the line width of 0.1 micron, and the sheet resistance is on the order of 15 ohms/square.

As will be appreciated from the foregoing description, the tungsten silicide strips 25a/25b are doped with different dopant impurities during the ion-implantations for the impurity regions 28a/28b and 28c/28d, and the dopant impurities are concurrently diffused from the doped tungsten silicide layers 25a/25b into the non-doped polysilicon strips 24a and 24b. As a result, the lithographic stages are decreased to a half of the second prior art process. On the other hand, the tungsten silicide is directly deposited over the non-doped polysilicon layer 24, and the process according to the present invention does not contain the complicated salicidation. For this reason, the process according to the present invention is free from the problems inherent in the first prior art process.

When the tungsten silicide is used, it is recommendable to carry out the diffusion between 800 degrees in centigrade and 1100 degrees in centigrade. If the temperature is lower than 800 degrees in centigrade, the diffusion is too slow to obtain a practical throughput.

If the temperature is higher than 1100 degrees in centigrade, the diffusion speed is too high to form shallow source and drain regions, which are required in a small size filed effect transistor. Furthermore, the resistance of the tungsten silicide is increased when the temperature exceeds 1100 degrees in centigrade.

Although particular embodiments of the present invention have been shown and described, it will be obvious to those skilled in the art that various changes and modifications may be made without departing from the spirit and scope of the present invention.

For example, the present invention is applicable to any dual gate process, i.e., an n-channel transistor with an n-type polysilicon gate and a p-channel transistor with a p-type polysilicon gate. Even if an n-channel type field effect transistor and a p-channel type field effect transistor do not form a complementary transistor, the process according to the present invention is applicable to a fabrication of an integrated circuit.

The present invention is applicable to a fabrication process of a field effect transistor.

What is claimed is:

1. A process of fabricating first and second field effect transistors opposite in channel conductivity type to each other, comprising the steps of:

a) preparing a semiconductor substrate having a first area covered with a first gate insulating layer and a second area covered with a second gate insulating layer and electrically isolated from one another;

b) depositing a first layer of intentionally undoped polysilicon over said first and second gate insulating layers by using chemical vapor deposition;

c) depositing a second layer of tungsten silicide on said first layer by using sputtering;

d) patterning said first and second layers into a first gate structure on said first gate insulating layer and a second gate structure on said second gate insulating layer by using lithographic techniques, said first gate structure having a first strip of said intentionally undoped polysilicon and a second strip of said tungsten silicide, said second gate structure having a third strip of said intentionally undoped polysilicon and a fourth strip of said tungsten silicide;

e) covering said second gate structure and said second area with a first photo-resist mask layer by using lithographic techniques;

f) implanting a first dopant impurity of one conductivity type into said first area and at least said second strip so as to form first impurity regions in said first area and dope said second strip with said first dopant impurity;

g) removing said first photo-resist mask layer;

h) covering said first gate structure and said second area with a second photo-resist mask layer by using lithographic techniques;

i) implanting a second dopant impurity of the opposite conductivity type to said one conductivity type into said second area and at least said fourth strip so as to form second impurity regions in said second area and dope said fourth strip with said second dopant impurity;

j) removing said second photo-resist mask layer; and k) heating said first and second impurity regions and said second and fourth strips to a temperature within a range from 800° C. to 1100° C. so as to concurrently form first source and drain regions from said first impurity regions and second source and drain regions from said second impurity regions and concurrently diffuse said first dopant impurity into said first strip and said second dopant impurity into said third strip.

2. A process of fabricating first and second field effect transistors opposite in channel conductivity type to each other, comprising the steps of:

a) preparing a semiconductor substrate having a first area covered with a first gate insulating layer and a second area covered with a second gate insulating layer;

b) forming a first layer of polysilicon over said first and second gate insulating layers;

c) laminating a second layer of tungsten silicide expressed by the chemical formula of $Wsi_x$ wherein x ranges from 1.5 to 3.0 on said first layer;

d) patterning said first and second layers into a first gate structure on said first gate insulating layer and a second gate structure on said second gate insulating layer, said first gate structure having a first strip of said polysilicon and a second strip of said tungsten silicide, said second gate structure having a third strip of said polysilicon and a fourth strip of said tungsten silicide;

e) covering said second gate structure and said second area with a first mask layer;

f) implanting a first dopant impurity of one conductivity type into said first area and at least said second strip so as to form first impurity regions in said first area and dope said second strip with said first dopant impurity;

g) removing said first mask layer;

h) covering said first gate structure and said second area with a second mask layer;

i) implanting a second dopant impurity of the opposite conductivity type to said one conductivity type into said second area and at least said fourth strip so as to form second impurity regions in said second area and dope said fourth strip with said second dopant impurity:

j) removing said second mask layer; and k) heating said first and second impurity regions and said second and fourth strips at about 900° C. for about 10 minutes so as to concurrently form first source and drain regions from said first impurity regions and second source and drain regions from said second impurity regions and concurrently diffuse said first dopant impurity into said first strip and said second dopant impurity into said third strip.

3. The process as set forth in claim 2, in which said first dopant impurity is one of arsenic and boron difluoride, and said second dopant impurity is the other of said arsenic and said boron difluoride.

4. The process as set forth in claim 3, in which said arsenic is ion implanted at a dose of $4\times10^{15}$ cm$^{-2}$ under acceleration energy of 50 KeV, and said boron difluoride is ion implanted at a dose of $3\times10^{15}$ cm$^{-2}$ under acceleration energy of 40 KeV.

5. The process as set forth in claim 4, in which said certain temperature is within a range from 800° C. to 1100° C.

6. The process as set forth in claim 2, in which said first layer is deposited by using low-pressure chemical vapor deposition in said step b).

7. The process as set forth in claim 2, in which said second layer is laminated on said first layer by using sputtering.

8. The process as set forth in claim 2, in which said first mask layer and said second mask layer are formed by using lithographic techniques.

9. The process as set forth in claim 2, further comprising l) covering said first and second gate structures and said first and second areas with an inter-level insulating layer;

m) forming contact holes at least exposing the first drain region and said second drain region in said inter-level insulating layer; and n) forming at least one wiring on said inter-level insulating layer connecting said first drain region through said contact holes to said second drain region so as to form said first and second field effect transistors into a complementary transistor.

* * * * *